(12) United States Patent
Reddy et al.

(10) Patent No.: US 7,974,595 B2
(45) Date of Patent: Jul. 5, 2011

(54) METHODOLOGY FOR ASSESSING DEGRADATION DUE TO RADIO FREQUENCY EXCITATION OF TRANSISTORS

(75) Inventors: Vijay Kumar Reddy, Plano, TX (US); Andrew Marshall, Dallas, TX (US); Siraj Akhtar, Richardson, TX (US); Srikanth Krishnan, Richardson, TX (US); Karan Singh Bhatia, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 700 days.

(21) Appl. No.: 12/013,221

(22) Filed: Jan. 11, 2008

(65) Prior Publication Data
US 2009/0167429 A1 Jul. 2, 2009

Related U.S. Application Data

(60) Provisional application No. 61/017,871, filed on Dec. 31, 2007.

(51) Int. Cl.
*H04B 17/00* (2006.01)
*H03C 1/62* (2006.01)

(52) U.S. Cl. .................. 455/115.1; 455/115.4; 370/279; 375/297

(58) Field of Classification Search ..... 455/115.1–115.4; 330/278–279, 423; 375/295–297, 137
See application file for complete search history.

(56) References Cited

U.S. PATENT DOCUMENTS

2006/0057980 A1* 3/2006 Haque et al. ................ 455/127.1
2007/0129029 A1* 6/2007 Litmanen ...................... 455/126

* cited by examiner

*Primary Examiner* — Christian A Hannon
(74) *Attorney, Agent, or Firm* — Warren L. Franz; Wade J. Brady, III; Frederick J. Telecky, Jr.

(57) ABSTRACT

One embodiment relates to an on-chip power amplifier (PA) test circuit. In one embodiment, a PA test circuit comprises a controllable oscillator (CO) configured to generate a radio frequency (RF) signal, a parallel resonant circuit tuned to the radio frequency, a pre-power amplifier (PPA) coupled to the CO and the parallel resonant circuit, the PPA configured to amplify and drive the RF signal from an output of the PPA into a load. The test circuit may further comprise a first transmission gate configured to couple the RF signal from the CO to an input of the PPA. One testing methodology for a PA test circuit comprises stressing the PPA with an RF signal, measuring a characteristic of the PPA, determining stress degradation from the characteristic measurements, and repeating the stressing and characteristic measurements until a maximum stress degradation is achieved or a maximum stress has been applied.

17 Claims, 7 Drawing Sheets

METHODOLOGY FOR ASSESSING DEGRADATION DUE TO RADIO FREQUENCY EXCITATION OF TRANSISTORS

RELATED APPLICATION

This application claims priority to Ser. No. 61/017,871 filed Dec. 31, 2007, which is entitled "Methodology For Assessing Degradation Due To Radio Frequency Excitation Of Transistors".

BACKGROUND OF THE INVENTION

In personal communications systems such as cell phones, low cost, high performance and reliability are important and ongoing goals. To reduce costs in such modern communications devices, there is a trend to convert analog circuits into digital architectures that can be more easily implemented in integrated circuit chips and/or in embedded circuit devices and to integrate previously discrete devices. To make and operate a low cost communications device, some components are stressed up to and beyond normal operation parameters for brief periods of time. Over time, an accumulation of stress applied to the components can slowly cause progressive degradation of the components and result in eventual failure to meet a desired component or system specification. However, if this stress can be accurately tested and modeled over time and environmental conditions such as temperature, an acceptable level of component or system performance and reliability can still be achieved despite the stress beyond normal operational parameters.

One communications area where such stress testing and modeling is particularly difficult is in the radio frequency (RF) section of a digital transceiver. It can be very difficult to mimic stresses to the RF section of an integrated circuit, these tests are often expensive and time consuming to perform, and it can be difficult to characterize the stress conditions.

Accordingly, there is a need in the electronics industry to provide a testing methodology and test structure suitable to test, characterize, model and accurately predict the performance of select RF components or systems of a communications device, in order to maintain low cost, high performance and reliability of the device.

SUMMARY OF THE INVENTION

The following presents a simplified summary of the invention in order to provide a basic understanding of some aspects of the invention. This summary is not an extensive overview of the invention, and is neither intended to identify key or critical elements of the invention nor to delineate the scope of the invention. Rather, the purpose of the summary is to present some concepts of the invention in a simplified form as a prelude to the more detailed description that is presented later.

In one embodiment, an on-chip RF power amplifier test circuit comprises a digitally controlled oscillator (DCO) configured to provide an RF signal at a predetermined frequency, a parallel resonant circuit tuned to the predetermined RF frequency, and a pre-power amplifier (PPA) coupled to the DCO and the parallel resonant circuit, and configured to amplify and drive the RF signal (as an RF transmission signal) at the predetermined frequency into an antenna, an equivalent load, or the parallel resonant circuit.

In another embodiment of the present invention, the test circuit may further comprise a first transmission gate configured to couple the DCO to the PPA, a second transmission gate configured to couple an input test pad to a gate input of the PPA, and a third transmission gate configured to couple an output test pad to a drain output of the PPA.

In one embodiment, the test circuit may further comprise a first peak detection circuit or a trough detection circuit coupled to the drain output of the PPA.

In another embodiment of the present invention, the test circuit may further comprise a second peak detection circuit coupled to the gate input of the PPA.

In another embodiment of the present invention, a testing methodology comprises measuring a characteristic of the PPA, stressing the PPA, re-measuring the characteristic of the PPA, determining a stress degradation level from the characteristic measurements of the PPA, and repeating the stressing and characteristic measurements on the PPA until a predetermined stress degradation level is achieved or a maximum stress has been applied.

In still another embodiment of the present invention, the measured characteristic comprises one or a combination of an Id, Vg, 1/f noise, Vpeak, output power, output conductance (gds=dIDS/dVDS), transconductance (gm=dIDS/dVGS), and I-V transfer characteristic.

In yet another embodiment of the present invention, the predetermined stress degradation comprises one or a combination of a maximum slope of the measured characteristic, and/or an acceleration (time rate of change) of the Vt, $I_{DSAT}$, Ig, 1/f (noise), or Vpeak.

Configured in this manner, the testing methodologies and test structures of the present invention are suitable to test, characterize, model and accurately predict the performance of select RF components or systems of a communications device, in order to maintain low-cost, high performance and reliability of the device.

The following description and annexed drawings set forth in detail certain illustrative aspects and implementations of the invention. These are indicative of but a few of the various ways in which the principles of the invention may be employed.

DETAILED DESCRIPTION OF THE INVENTION

The present invention will now be described with respect to the accompanying drawings in which like numbered elements represent like parts. The figures and the accompanying description of the figures are provided for illustrative purposes and do not limit the scope of the claims in any way.

In communications devices having radio frequency (RF) digital transceivers, low cost, high performance and reliability is required. To insure this performance and reliability despite the voltage and temperature stresses these circuits experience, RF testing is also needed. However, testing and modeling the RF components or sections of such transceivers is generally very difficult and time consuming to accomplish, can dramatically affect the circuit operation which is to be monitored and thus result in inaccuracies.

Figure 1A:
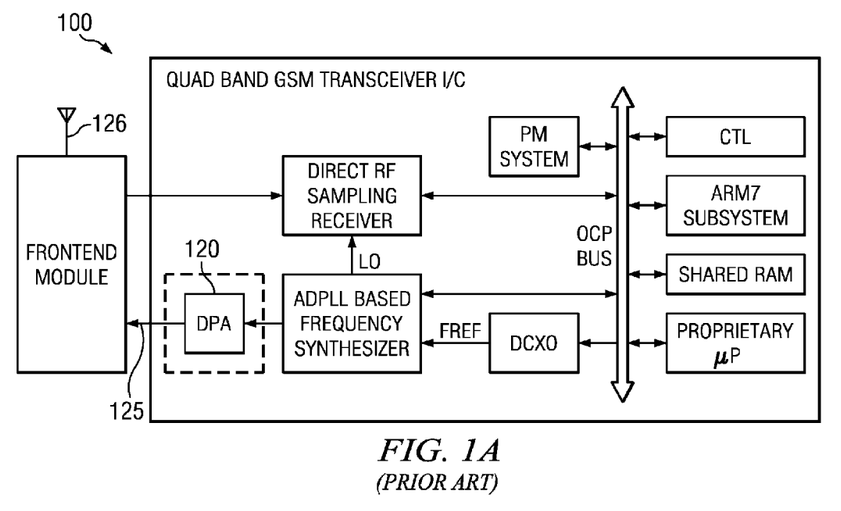
FIG. 1A is a simplified block diagram of a conventional single chip radio based on a digital radio process architecture using a digital pre-power amplifier (PPA) to transmit a radio signal.

FIG. 1A illustrates one conventional single-chip radio transceiver 100 based on a digital radio process (DRP) architecture, such as may be used in a cell phone. The radio transceiver 100 comprises a pre-power amplifier (PPA) 120 that is digitally controlled, also known as a digital PPA (DPA), to transmit a radio frequency (RF) signal 125, for example, to an antenna 126 of the radio transceiver 100.

Figure 1B:
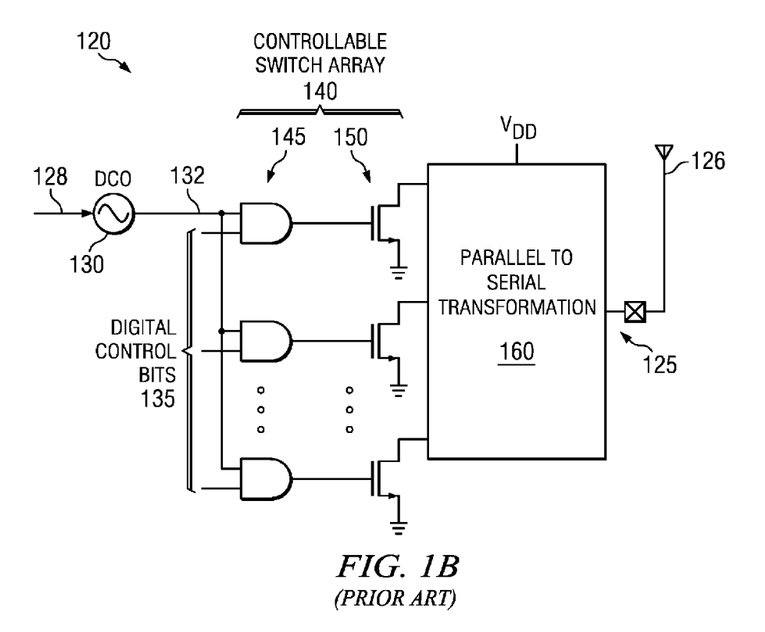
FIG. 1B is a simplified schematic diagram of the conventional digitally controlled PPA (DPA) using a digitally controlled transistor switching array to selectively adjust the transmission power of the radio signal.

FIG. 1B illustrates additional details of the conventional digitally-controlled PPA 120 using a digitally-controlled transistor switching array 140 to selectively adjust the transmission power of the radio signal 125. DPA 120 comprises two or more digital control bits 135, two or more control gates 145 controlled by the digital control bits 135, and a switch array 140 comprising two or more transistor switches 150 controlled by the two or more control gates 145. The switches 150 (e.g., nMOS, pMOS transistors) are configured to be selectively coupled in parallel in response to the two or more digital control bits 135 representing a digital word. The DPA 120 may further comprise a parallel to serial transformation circuit 160 configured to receive the outputs of selected two or more switches 150 as inputs and to provide a power increase/decrease to the output of the DPA 120 according to a binary weighting (e.g., 1, 2, 4, 8,...) value corresponding to, and in response to, the digital control bits 135.

In operation, a digitally controlled oscillator (DCO) 130, initiated by enable signal 128, is operable to supply an RF signal 132 to the control gates 145 of DPA 120.

According to the value of the digital word represented by the digital control bits 135, a unique combination of the transistor switches 150 will be selected and fed to the parallel to serial transformation circuit 160 which in turn sets a power level of the RF output signal 125 to antenna 126 of transceiver 100.

As previously indicated, however, testing such RF pre-power amplifier circuits at RF frequencies is fraught with many difficulties, such as trying to apply external RF signals which accurately represent the RF signals applied to such pre-power amplifiers, or trying to accurately measure the output voltage, current, and power or various other characteristics of the PPA without adversely affecting the operation and output of the PPA. For example, if the resonant circuit is detuned by the relatively large probe capacitances of the monitoring equipment, the output signal amplitude and frequency may become atypical, which then makes the characterization of the PPA inaccurate.

Figure 2:
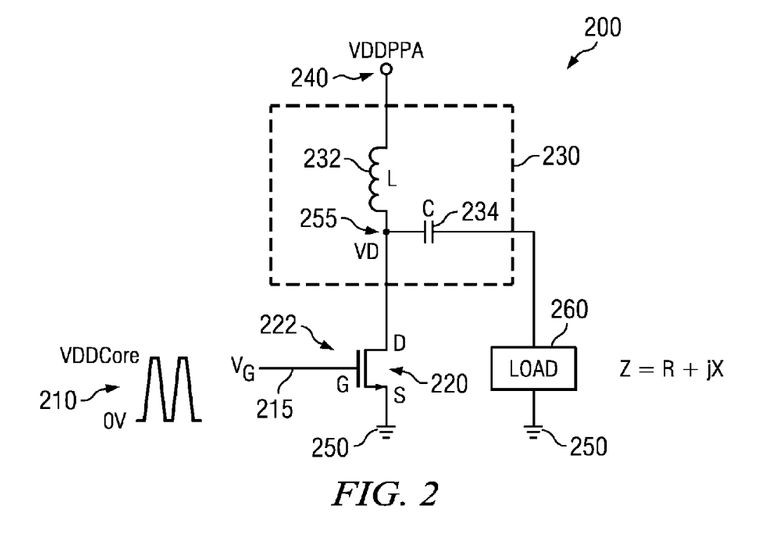
FIG. 2 is a simplified schematic diagram of one digital pre-power amplifier (DPA) used to amplify an RF signal utilizing a low voltage high power nMOS transistor inverter and a parallel resonant circuit, in accordance with one or more aspects of the present invention.

FIG. 2 illustrates one digital pre-power amplifier DPA 200 used to amplify an RF signal 210 utilizing low voltage (e.g., 1.1V) high power (e.g., nMOS) transistor 220 (inverter 222) and a parallel resonant circuit 230, in accordance with one or more aspects of the present invention. The exemplary parallel resonant circuit 230, for example, may comprise an inductor 232 and a capacitance 234 coupled to an antenna or load 260. The DPA circuit 200 is coupled between, and supplied by, VDDPPA 240, (e.g., 1.4V) and a ground/common 250. The RF signal 210 (e.g., f =2 GHz) may be provided by a ring oscillator, for example, to the gate terminal G 215 as a gate voltage Vg 210. The RF signal 210 has a voltage swing, for example, between 0V and VDDCore, and approximates a square-wave signal at a desired frequency (e.g., f =2 GHz). The impedance Z of the antenna/load 260 may be expressed as: $Z=R+jX$, where R=resistive component and jX=imaginary component. The power of the pre-power amplifier PPA 200 can also be expressed as $P_{RF} \alpha \frac{1}{2} Vpk^2/R$.

The gain of the nMOS PPA transistor 220 acting as a high power inverter 222 is configured to amplify the RF signal 210 to provide a higher voltage/current and therefore provide a higher power RF output signal VD 255 at, for example, the drain terminal D of transistor 220.

Figure 3:
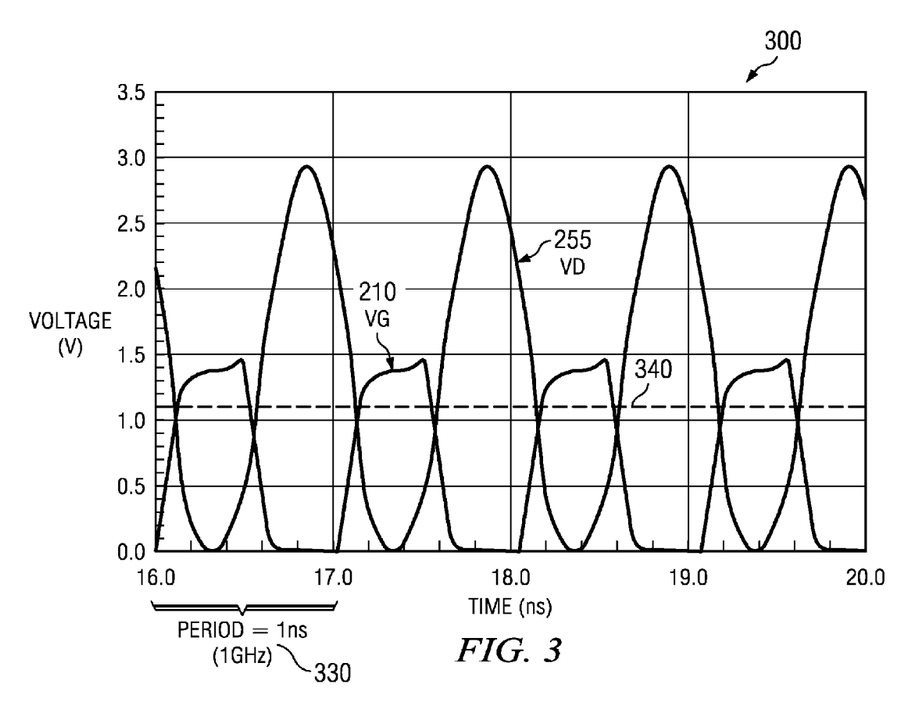
FIG. 3 is a plot of the RF signal applied to the digital pre-power amplifier DPA of FIG. 2 and the amplified output signal of the DPA at the drain node of the DPA nMOS transistor, demonstrating the large voltage swing of the RF output signal, in accordance with one or more aspects of the present invention.

FIG. 3 illustrates waveforms 300 of the RF signal VG 210 as a gate voltage VG, applied to the digital pre-power amplifier DPA 200 of FIG. 2, and the amplified output signal VD 255 of the DPA 200 at an antenna or similar load 260, demonstrating the large voltage swing of the RF output signal VD 255, in accordance with one or more aspects of the present invention. Because of the power gain of transistor 220, it is shown that the peak-to-peak voltage swing of the input RF signal VG 210 applied to the gate is about 1.4 VP-P (e.g., 0-VDD), while the resonant amplified output of the PPA transistor 220 is about 2.9 VP-P (e.g., 0-~2*VDD). In this example, the input signal VG 210 and output signal VD 255 have a period 330 of 1 ns (1 GHz).

As indicated above, the RF nMOS power transistor 220 may have a nominal voltage rating of about 1.1V indicated at 340, and a gain of about 2. With these transistor characteristics, the output VD 255 is about two times that of the input VG 210, for an amplified voltage swing of about 2.9 VP-P. This operation at a voltage which is greater than the nominal voltage rating is classed as a "voltage stress" on the RF drive transistor 220 of the DPA 200. While such operation provides a great deal of power at a lower cost, as was also indicated previously, this voltage stress over time and temperature conditions, for example, can cause degradation of the power output and, eventually, failure of certain characteristics of the transceiver to meet specifications.

Figure 4:
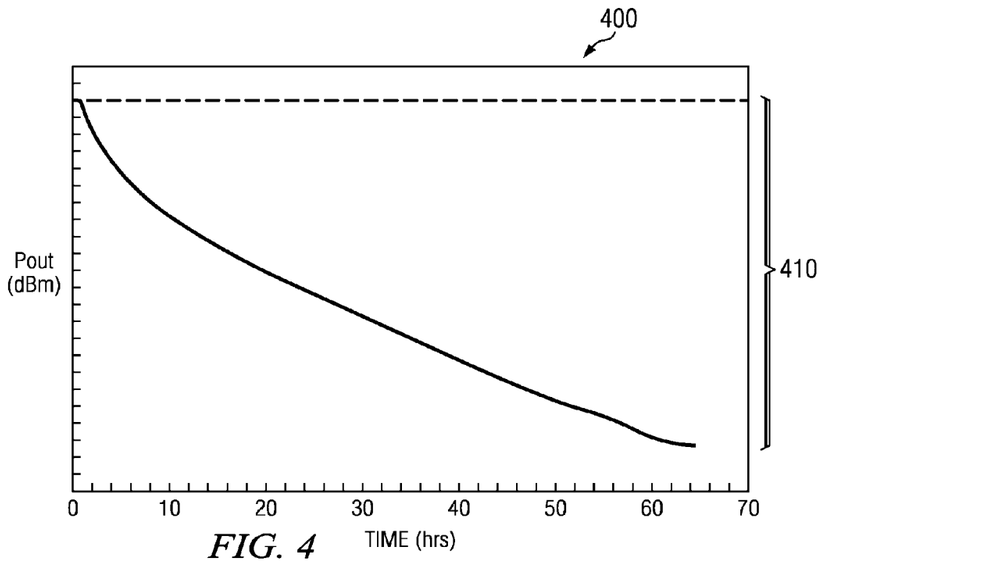
FIG. 4 is a plot of the output power degradation of the digital pre-power amplifier DPA of FIG. 2 that may occur in less than 100 hours, for example, due to the large voltage swing stress conditions illustrated in the plot of FIG. 3.

FIG. 4, for example, illustrates a plot 400 of the output power degradation of the digital pre-power amplifier DPA 200 of FIG. 2 that may occur in less than 100 hours due to the application of the large voltage swing stress conditions illustrated in the plot 300 of FIG. 3. This power reduction in the output of the PPA is believed to be due to reduced drive strength and transconductance or power gain degradation. For example, FIG. 4 illustrates a measurable power loss 410 in the output power Pout (in dBm) from DPA 200 over a stress interval of, for example, about 65 hours.

However, the inventors of the present invention have appreciated that if this stress is only applied for short periods of time and can be accurately characterized, modeled and managed in the context of the PPA design and operation, a predictable reliability can still be obtained while maintaining a low product cost.

Accordingly, the inventors of the present invention have also appreciated that if this RF voltage stress can be internally generated and applied to an on-chip test structure which realistically emulates the DPA characteristics of an actual transceiver, accurate power amplifier characteristics can then be measured and modeled to yield the necessary device degradation physics that permit accurate reliability predictions.

Figure 5:
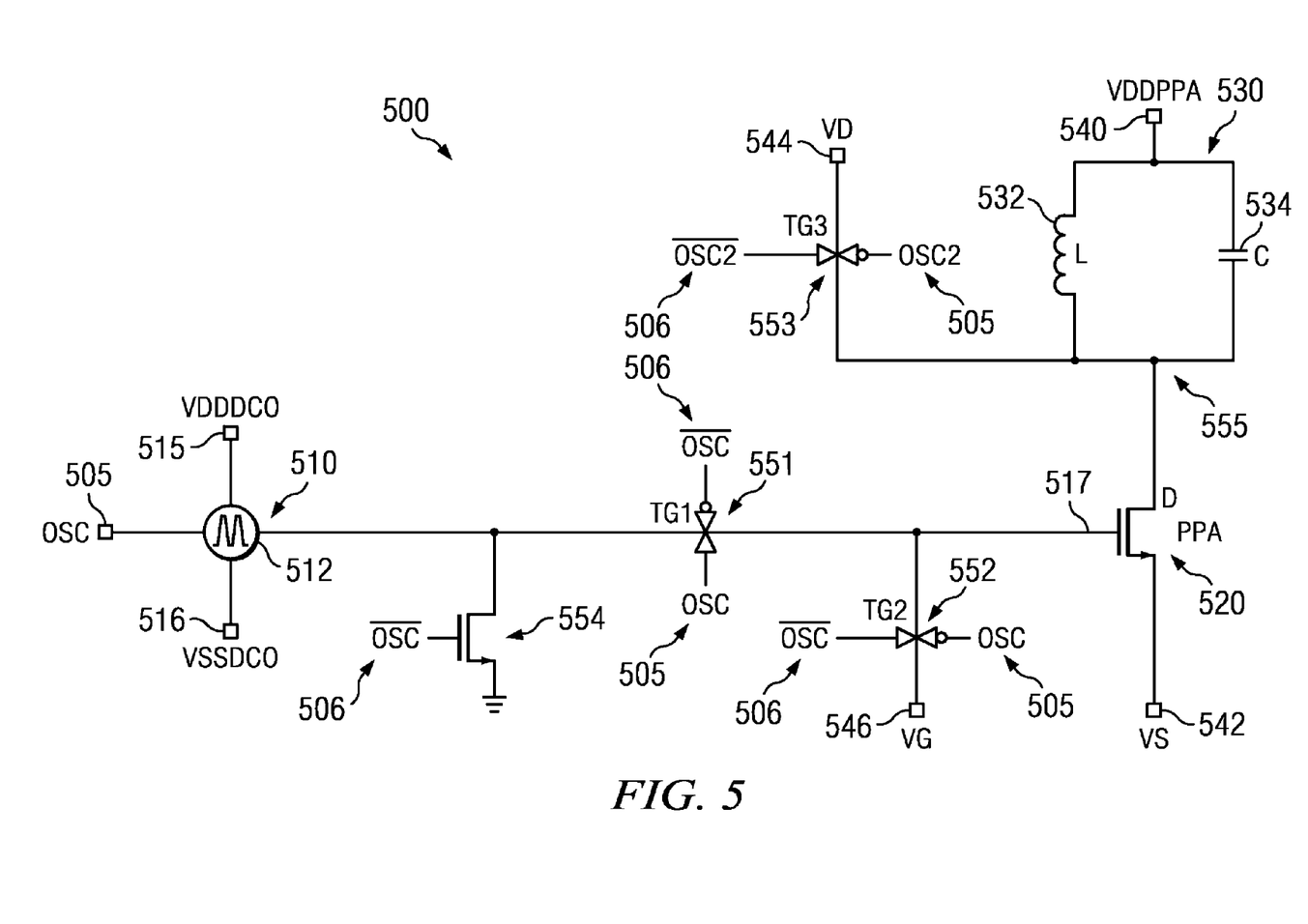
FIG. 5 is a simplified schematic diagram of an exemplary DPA test circuit, the DPA comprising a PPA driven by an RF digitally controlled oscillator (DCO), the PPA coupled to a parallel resonant circuit, in accordance with one or more aspects of the present invention.

FIG. 5, for example, illustrates an exemplary DPA test circuit 500, such as may be used in accordance with one or more aspects of the present invention to emulate the stresses applied to a DPA based transceiver, such as DPA 120 of FIGS. 1A and 1B. The DPA test circuit 500, for example, comprises a PPA 520 (e.g., one or more nMOS or pMOS transistors, such as the parallel transistor switch array 150 of FIG. 1B) coupled to a parallel resonant circuit 530, the PPA 520 driven by an RF digitally controlled oscillator (DCO) 512 or voltage controlled oscillator (VCO) 512. The DCO 512 may comprise a ring oscillator enabled by OSC enable input 505 or disabled by disable transistor 554, or another such component configured to disable the RF output signal 510 from the oscillator 512, for example. The DCO 512 is also supplied by a VDD level at VDDDCO 515 and by a VSS level at VSSDCO 516. Similarly, PPA 520 and the parallel resonant circuit 530 are supplied by a VDD level at VDDPPA 540 and by a VS level at VS 542.

DPA test circuit 500 may further comprise one or more transmission gates TG1 (551), TG2 (552), and TG3 (553) (e.g., analog gate, switch), comprising an nMOS and a pMOS transistor configured in parallel, acting as a bidirectional switch. The transmission gates of DPA test circuit 500 conduct or allow passage of a signal, for example, when an OSC enable signal 505 at test pad 505 is applied to the nMOS transistor and an OSC-Bar enable signal 506 is applied to the pMOS transistor portions of the transmission gates TG1 (551), TG2 (552), and TG3 (553) of FIGS. 5 and 6. For example, transmission gate TG1 (551) is used to couple the DCO 512 to the input 517 (e.g., gate terminal G) of the PPA 520, transmission gate TG2 (552) is used to couple an input test pad VG 546 to the input 517 (e.g., gate terminal G) of the PPA 520, transmission gate TG3 (553) is used to couple an output test pad VD 544 to the output 555 (e.g., drain terminal D) of the PPA 520. It will be appreciated by those skilled in the art that OSC-Bar 506 can also be internally generated using an inverter (not shown) and the OSC 505 input, without the use of an additional OSC-Bar 506 test pad.

Configured in this manner, the DPA test circuit 500 is operable to be tested by simply providing DC enable voltages and signals rather than having to apply the more problematic RF signals, while the higher power output signal 555 at the drain of PPA 520 may be monitored at test pad VD 544.

For example, one test procedure using the DPA test circuit 500 may comprise a measurement phase, wherein the DCO is disabled by holding OSC 505 to a low state and OSC-Bar 506 to a high state, which pulls DCO 512 output signal 510 low with disable transistor 554 (or another such component configured to disable the RF signal 510 from the oscillator 512 based on the state of a disable signal such as OSC-Bar 506), and TG1 551 is turned off and TG2 552 and TG3 553 are turned on. With these conduction states, TG1 551 further disconnects the DCO 512 from PPA 520, test pad VD 544 is coupled to the drain of PPA 520 and test pad VG 546 is coupled to the gate of PPA 520, to permit various I-V measurements, such as threshold voltage Vt, drain current $Id_{LIN}$, saturation current Isat, transconductance, power and transfer characteristics to be made on the PPA 520. These measurements would form the initial characteristic conditions of the PPA 520 for the DPA test circuit 500.

Then, in a stress phase, the DCO is enabled to provide an RF signal to stress the PPA 520. To set up this stress phase, the DCO 512 is enabled by bringing OSC 505 to a high state and OSC-Bar 506 to a low state, which turns off disabling transistor 554 enabling DCO output signal 510, and TG1 551 is turned on and TG2 552 and TG3 553 are turned off. With these conduction states, TG1 551 connects the DCO 512 to the input 517 of PPA 520, test pad VD 544 is decoupled from the drain of PPA 520 and test pad VG 546 is decoupled from the gate of PPA 520, to permit unhindered stress testing of the PPA 520. Such stress testing may then continue for a predetermined period of time on the PPA 520 of the DPA test circuit 500.

After the predetermined period of stress testing time, the PPA 520 characteristic measurements may then be repeated as described in the measurement phase to determine how much degradation the PPA 520 has experienced over the time of stress. Further stress testing may then be repeated based upon the degradation results and/or the total stress testing time, for example.

Figure 6:
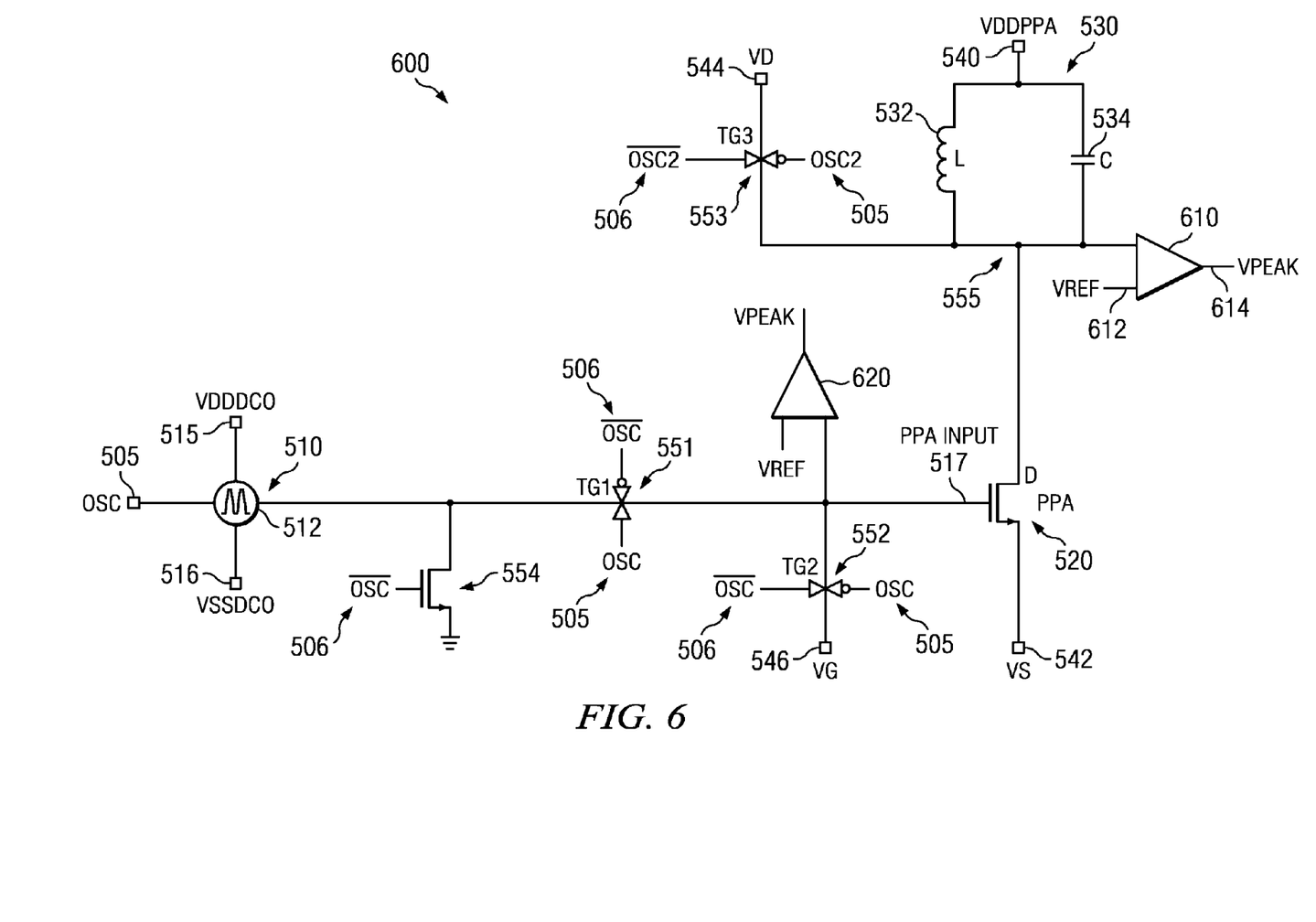
FIG. 6 is a simplified schematic diagram of an exemplary DPA test circuit, the DPA comprising a PPA driven by an RF digitally controlled oscillator (DCO), the PPA coupled to a parallel resonant circuit and a peak/trough detector, in accordance with one or more aspects of the present invention.

Similarly, FIG. 6 is another exemplary DPA test circuit 600, such as may be used in accordance with one or more aspects of the present invention to emulate the stresses applied to a DPA based transceiver, such as DPA 120 of FIGS. 1A and 1B. The DPA test circuit 600, is similar in most aspects to that of DPA test circuit 500 of FIG. 5, and as such need not be described again for the sake of brevity.

In one embodiment, however, the DPA test circuit 600 of FIG. 6 further comprises a first peak detector 610 (e.g., an operational amplifier, a comparator, or a gate/diode/capacitor circuit) coupled to the drain output 555 of the PPA 520. A voltage reference VREF 612 sets a desired level for the peak (or a trough) detection, which is output at VPEAK 614. The first peak detector 610 could be useful to provide on-chip DC monitoring of the RF signal output 555 of the PPA 520, while avoiding the need to directly interface with RF signals. This has the benefit of permitting improved isolation of the monitoring equipment, as well as the use of simple/low cost DC test equipment such as an inexpensive digital multi-meter (DMM), for example. Further, in one embodiment of the peak detector 610 that stores the peak measurement for a time, VPEAK 614 may be read both during and after the stressing phase, such as during the measurement phase. Those skilled in the art will appreciate that the peak detection circuits (or peak detector) described herein for detecting a maximum voltage or current can also be used as, or replaced by, a trough detection circuit (or trough detector) to detect a minimum voltage or current.

In another embodiment of the present invention, the DPA test circuit 600 of FIG. 6 may further comprise a second peak detection circuit 620 (e.g., an operational amplifier, a comparator, or a gate/diode/capacitor circuit) coupled to the gate input 517 of the PPA 520. The second peak detector 620 could also be useful to provide on-chip DC monitoring of the RF signal 510 at input 517 to the PPA 520 (during or after the stress phase if peak storage is utilized), while avoiding the need to directly interface with RF signals. Again, this has the benefit of permitting improved isolation of the monitoring equipment, as well as the use of simple/low cost DC test equipment such as an inexpensive digital multi-meter (DVM, DMM), for example.

It is appreciated that either of the testing circuits 500 of FIG. 5 or 600 of FIG. 6, may be implemented on-chip as a built-in self-test (BIST) circuit, as a wafer level test circuit, and as a wafer-level scribe line test circuit. Thus, it is anticipated that such stress testing and PPA characterization may be accomplished before, during, or after fabrication of the fully operational PPA and DPA which the test circuit seeks to emulate and/or model. In addition, it is also anticipated that the test circuits illustrated and described herein may be formed as a part of, together with, or on the same chip as the fully operational PPA and DPA which the test circuit seeks to emulate and/or model.

Those skilled in the art will appreciate that the DCO (e.g., 512), the parallel resonant circuit (e.g., 530), and the pre-power amplifier PPA 520 utilized in the test circuits of FIGS. 5 and 6 may not require all of the illustrated circuit components in some configurations or applications. Many other oscillator, parallel resonant circuit and power amplifier circuit variations are also contemplated in the context of the present invention, wherein a DCO, and a pre-power amplifier are used to stress and characterize a digital pre-power amplifier DPA.

The test circuits and methods illustrated and described in the present invention are suitable for use in testing RF digital pre-power amplifier applications such as cell phones and PDA's.

Although the invention has been illustrated and described with respect to one or more implementations, alterations and/or modifications may be made to the illustrated examples without departing from the spirit and scope of the appended claims.

Further, although in the illustrated embodiments, the one or more transistors are n-type metal-oxide semiconductor (nMOS) transistors (nMOS), p-type metal-oxide semiconductor (pMOS) transistors could also be used, as could other types of switching devices (in other embodiments, transistors, bipolar junction transistors (BJTs), vacuum tubes, relays, etc.). Numerous other such variations are also possible within the spirit and scope of the invention, and as such are anticipated.

Further, in various embodiments, portions of the test circuits 500 and 600 may be integrated into an integrated circuit, although in other embodiments the test circuits may be comprised of discrete devices.

In addition to or in substitution of one or more of the illustrated components, the illustrated test circuits and methods of the invention may include suitable circuitry, state machines, firmware, software, logic, etc. to perform the various methods and functions illustrated and described herein, including but not limited to the methods described below.

In one embodiment, a method of efficiently stressing, testing and characterizing an RF digital pre-power amplifier, comprises measuring a characteristic of the pre-power amplifier, stressing the pre-power amplifier with an RF signal, re-measuring the characteristic of the pre-power amplifier, determining a stress degradation from the characteristic measurements of the pre-power amplifier, and repeating the stressing and characteristic measurements on the pre-power amplifier until a maximum stress degradation is achieved or a maximum stress has been applied to the pre-power amplifier.

While the methods illustrated herein are illustrated and described as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention.

In addition, not all illustrated steps may be required to implement a methodology in accordance with the present invention. Furthermore, the methods according to the present invention may be implemented in association with the operation of systems or circuits which are illustrated and described herein (e.g., embodiments of testing circuits 500 of FIG. 5 or 600 of FIG. 6) as well as in association with other systems or circuits not illustrated, wherein all such implementations are contemplated as falling within the scope of the present invention and the appended claims.

Figure 7:
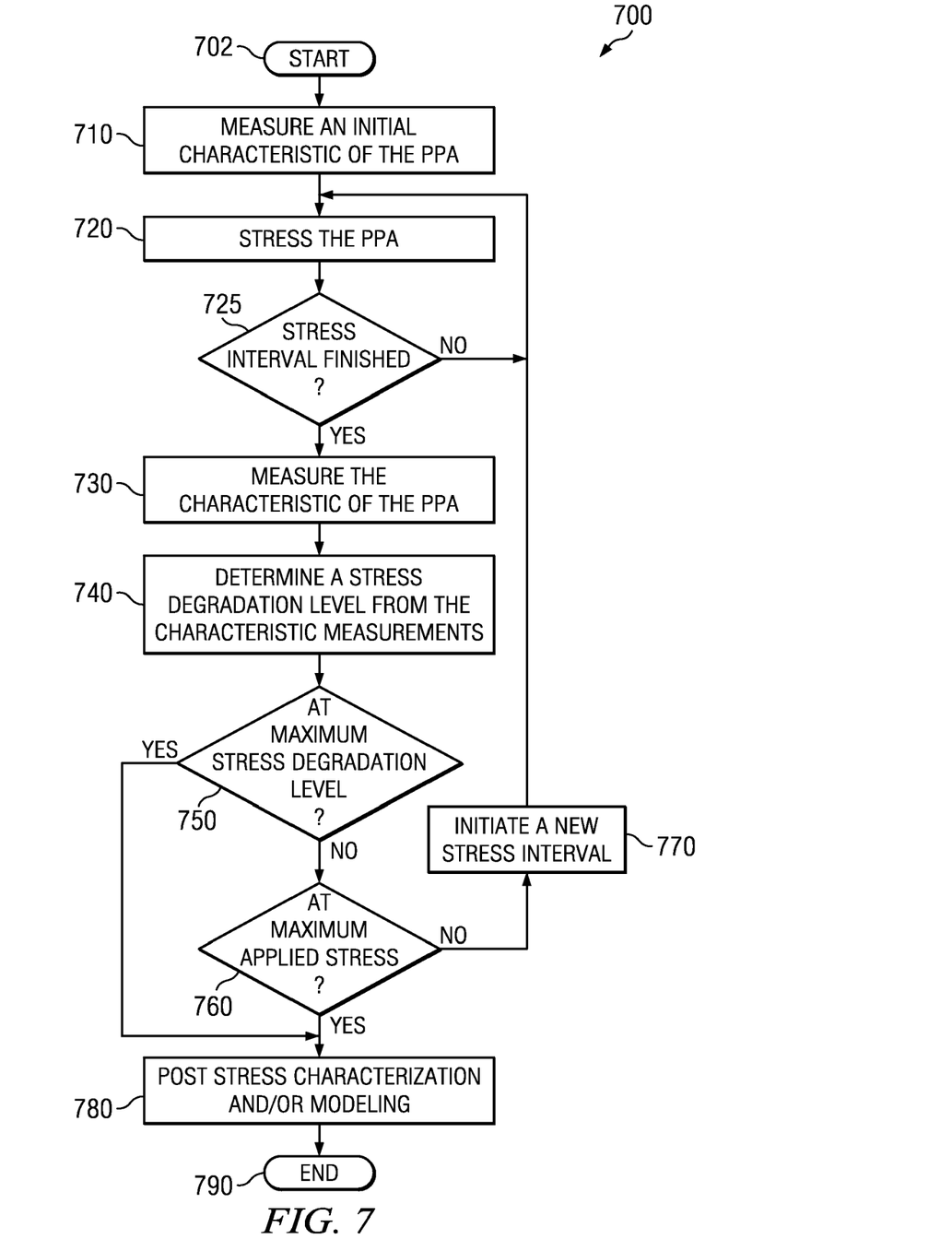
FIGS. 7 and 8 are flow diagrams of exemplary methodologies for stress testing and characterizing the exemplary digital pre-power amplifiers of FIGS. 5 and 6, in accordance with the present invention.
Figure 8:
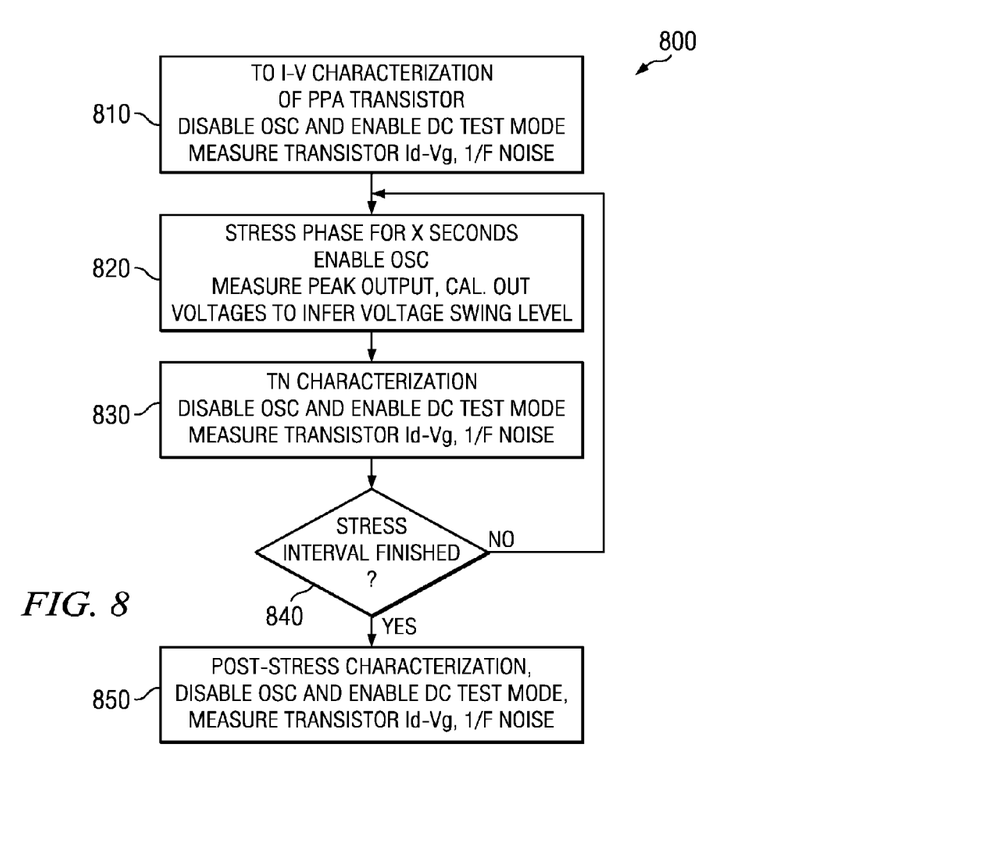

Referring now to FIGS. 7 and 8, exemplary methodologies for stress testing and characterizing the exemplary digital pre-power amplifiers of FIGS. 5 and 6, are illustrated in accordance with the present invention.

For example, in the method 700 of FIG. 7 for stress testing and characterizing the exemplary digital pre-power amplifiers 520 of FIG. 5 or 6 of a test circuit 500 or 600, respectively, the method begins at 702.

At 710, a characteristic (e.g., one or a combination of a drain current Id, a gate voltage Vg, a noise 1/f, a peak voltage Vpeak, an output power, and an I-V transfer characteristic) of the pre-power amplifier 520 is initially measured.

At 720, the pre-power amplifier 520 is stressed by the application of an RF signal (e.g., RF signal 510, gate signal 210, at 1 GHz), by the DCO 512 (e.g., ring oscillator).

The stressing continues at, and back to, 720 until it is determined at 725 that the current stress interval is finished, for example, based upon a predetermined time interval, or a DCO output signal 510 cycle count.

At 730, after the current stress interval is finished, the characteristic of the pre-power amplifier (e.g., PPA 520) is again measured.

At 740, a stress degradation level is determined from the characteristic measurements made on the pre-power amplifier PPA 520. For example, the characteristic measurements may be used to determine a stress degradation as one or a combination of a slope or a time rate of change (acceleration) of the threshold voltage Vt, drain saturation current $I_{DSAT}$, gate current Ig, noise 1/f, peak voltage Vpeak, and output power of the PPA 520, for example.

At 750, the determined stress degradation level of step 740 is compared to a (predetermined) maximum stress degradation level, for example, comprising one or a combination of a maximum slope or a maximum time rate of change of the threshold voltage Vt, drain saturation current $I_{DSAT}$, gate current Ig, noise 1/f, peak voltage Vpeak, and output power.

If at 750 the (predetermined) maximum stress degradation level has not been achieved, then the method 700 continues to step 760 where it is also determined if a maximum stress has been applied to the pre-power amplifier, for example, based upon a predetermined maximum total stress time, or a maximum stress interval count.

If this maximum applied stress has not yet been applied at 760, then a new stress interval is initiated at 770 and the stressing and characteristic measurements on the pre-power amplifier are repeated (back to step 720) until a maximum stress degradation is achieved, as decided at 750, or until a maximum stress has been applied to the pre-power amplifier, as decided at 760.

Then, when the maximum stress degradation is achieved, as decided at 750, or the maximum stress has been applied to the pre-power amplifier, as decided at 760, method 700 continues to 780.

Figure 9A:
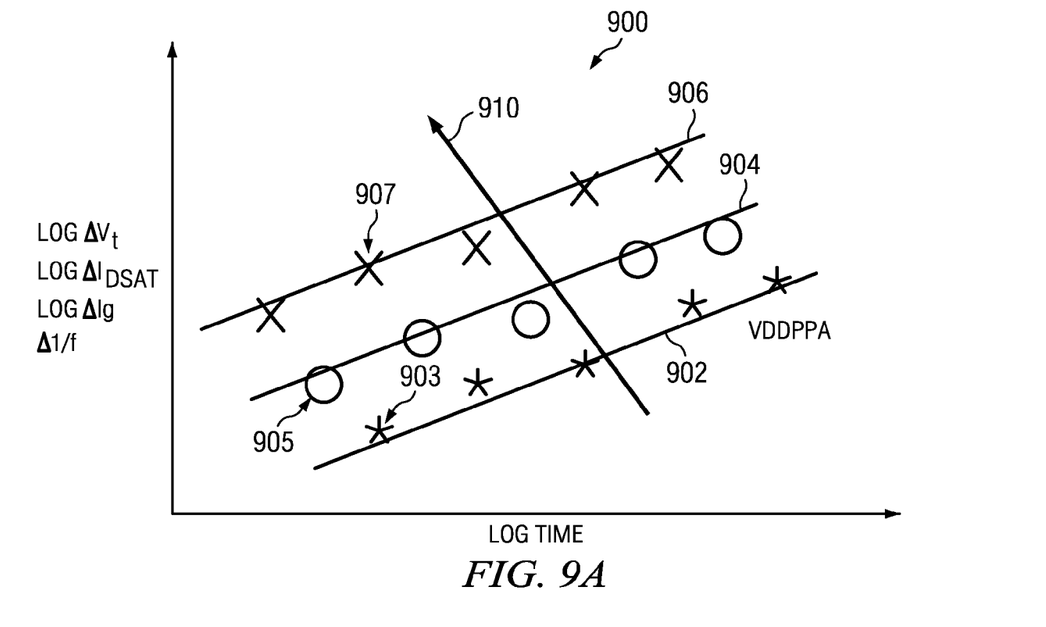
FIGS. 9A and 9B are plots of exemplary characteristics which may be monitored and various degradation levels together with evaluation of the physical mechanisms that may be determined from the stress testing and characteristics measurements according to the testing methodologies of FIGS. 7 and 8, such as may be applied to the DPA's of FIGS. 5 and 6, in accordance with one or more aspects of the present invention.
Figure 9B:
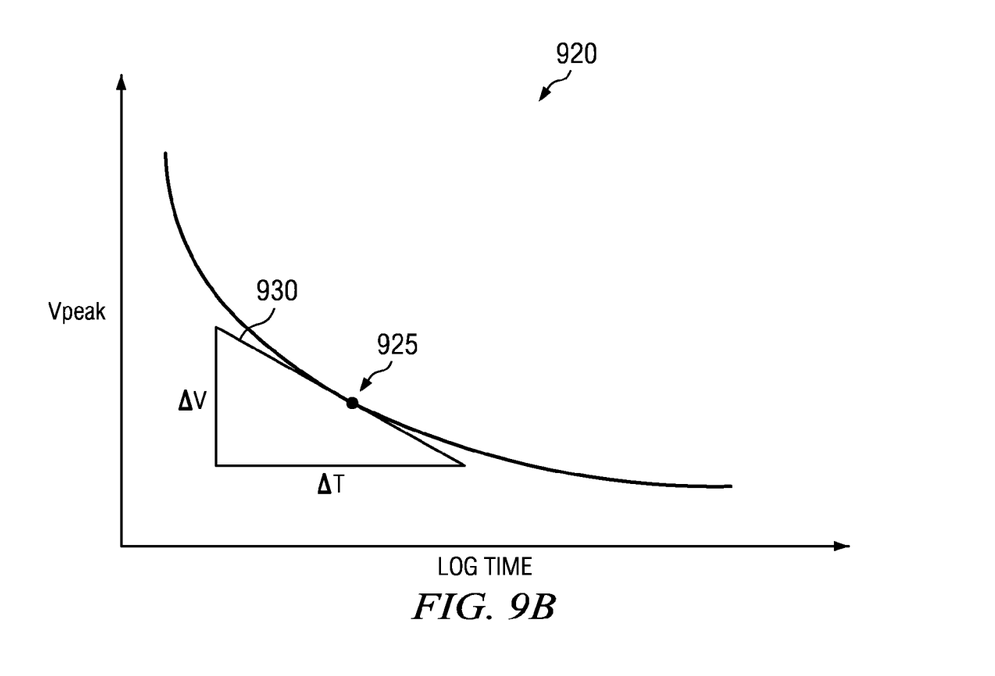

Finally, at 780, a final characteristic (e.g., one or a combination of a drain current Id, a gate voltage Vg, a noise 1/f, a peak voltage Vpeak, an output power, and an I-V transfer characteristic) of the pre-power amplifier 520 is measured, wherein the complete set of characteristic measurements may be compiled to provide a post stress characterization and/or modeling. Such characterization and/or modeling can then be analyzed and/or modeled as illustrated in FIGS. 9A and 9B described below, to determine a final stress degradation level, and to make useful predictions of the reliability of the test circuit DPA and an associated DPA used in the end product, which is emulated/modeled by the test circuit DPA.

Thereafter, the testing methodology 700 ends at 790.

FIG. 8 illustrates another exemplary methodology 800 for stress testing and characterizing the exemplary digital pre-power amplifiers of FIGS. 5 and 6, in accordance with the present invention.

For example, method 800 of FIG. 8 provides for stress testing and characterizing the exemplary digital pre-power amplifiers 520 of FIGS. 5 and 6 of the test circuits 500 and 600, respectively.

At 810 (e.g., time T0), a characteristic (e.g., one or a combination of a drain current Id, a gate voltage Vg, a noise 1/f, a peak voltage Vpeak, an output power, and an I-V transfer characteristic) of the pre-power amplifier 520 is initially measured.

For example, testing of the DPA test circuit 600 of FIG. 6, may comprise a measurement phase, wherein the DCO is disabled by holding OSC 505 to a low state and OSC-Bar 506 to a high state, which pulls DCO 512 output signal 510 low by the conduction of disable transistor 554, and enables the DC test mode as TG1 551 is turned off and TG2 552 and TG3 553 are turned on. With these conduction states, TG1 551 further disconnects DCO 512 from PPA 520, test pad VD 544 is coupled to the drain of PPA 520 and test pad VG 546 is coupled to the gate of PPA 520. This measurement phase test set-up permits DC supply voltages to be applied to test pads VDDDCO 515, VSSDCO 516, VDDPPA 540 and VS 542, DC enable/disable voltages to be applied to test pads OSC 505 and OSC-Bar 506, which can also be internally generated using an inverter (not shown) and the OSC 505 input, and DC gate and drain measurement of PPA 520 to be made at test pads VG 546 and VD 544, respectively, for example with a simple and inexpensive digital multi-meter (DMM). This measurement phase test set-up permits various I-V measurements, such as threshold voltage Vt, drain current $Id_{LIN}$, saturation current Isat, transconductance, power and transfer characteristics to be made on the PPA 520, for example, by directly measuring at the test pads VD 544 and VG546. These measurements would form the initial characteristic conditions of the PPA 520 for the DPA test circuit 500 at method step 810.

Further, the first peak detector 610 having the output VPEAK 614, can provide on-chip DC monitoring of the RF signal output 555 of the PPA 520, to avoid the need to directly interface with RF signals. For example, this circuit (using a peak storage capability) permits VPEAK 614 to be read during both the measurement phase and the stressing phase. Thus, simple/low cost DC test equipment may again be used such as an inexpensive digital multi-meter (DMM), for example.

At 820, the pre-power amplifier 520 is stressed by the application of an RF signal (e.g., RF signal 510, gate signal 210, at 1 GHz), supplied by the DCO 512 (e.g., ring oscillator). During this stress phase, the DCO is enabled to provide an RF signal 510 to stress the PPA 520, for example, for a predetermined period of time. To set-up this stress phase, the DCO 512 is enabled by bringing OSC 505 to a high state and OSC-Bar 506 to a low state, which turns off disabling transistor 554 enabling DCO output signal 510, and TG1 551 is turned on while TG2 552 and TG3 553 are turned off. With these conduction states, TG1 551 connects the DCO 512 to the input 517 of PPA 520, test pad VD 544 is decoupled from the drain of PPA 520 and test pad VG 546 is decoupled from the gate of PPA 520, to permit unhindered stress testing of the PPA 520. Such stress testing may then continue for a predetermined period of time on the PPA 520 of the DPA test circuit 500.

This stress phase test set-up once again permits DC supply voltages to be applied to test pads VDDDCO 515, VSSDCO 516, VDDPPA 540 and VS 542, and DC enable/disable voltages to be applied to test pads OSC 505 and OSC-Bar 506. This stress phase test set-up also avoids any gate and drain capacitive effects to PPA 520 from test pads VG 546 and VD 544, respectively, by turning off TG2 552 and TG3 553. Again, the first peak detector 610 provides on-chip DC monitoring capability of the peak of the RF signal output 555 of the PPA 520, for example, during the stress phase, using simple/low cost DC test equipment such as a DMM. Further, a second peak detector connected to the RF signal input 517 to the PPA 520 could also be useful to provide on-chip DC monitoring of the peak of the RF signal 510. This second peak detection can be used as a calibration output to infer voltage swing levels of the input (e.g., RF signal 510 at input 517) relative to the output (e.g., output signal 555 measured at VPEAK 614), or to determine the PPA power gain, for example.

At 830 (e.g., time TN), after the predetermined period of stress testing time, the PPA 520 characteristic measurement (e.g., one or a combination of a drain current Id, a gate voltage Vg, a noise 1/f, a peak voltage Vpeak, an output power, and an I-V transfer characteristic) may then be repeated as described in the measurement phase above, for example, to determine how much degradation the PPA 520 has experienced over the time of stress.

At 840, it is determined whether the current stress interval is finished. The stress testing continues back to 820 until it is determined at 840 that the current stress interval or alternately the total applied stress is finished. This decision may be based upon a predetermined time interval. Further stress testing may then be repeated back to 820, based upon stress or output power degradation results and/or the total stress testing time, for example.

At 850, a post-stress testing characterization is accomplished similar to that which is described above for the measurement phase of step 810 and 830. In the post-stress characterization, a final measurement is read. The complete set of characteristic measurements may be analyzed and/or modeled as illustrated in FIGS. 9A and 9B described below, to determine a final stress degradation level, and to make useful predictions of the reliability of the test circuit DPA and an associated DPA used in the end product, which is emulated/modeled by the test circuit DPA.

FIGS. 9A and 9B illustrate exemplary characteristic analysis methods which may be accomplished to identify various forms of PPA degradation physics from the stress testing and characteristics measurements obtained according to the testing methodologies of FIGS. 7 and 8, such as may be applied to the DPA's of FIGS. 5 and 6, in accordance with one or more aspects of the present invention.

Plot 900 of FIG. 9A, for example, illustrates an exemplary voltage or current acceleration or the time rate of change phenomenon in any of the following characteristics: a log $\Delta$Vt, log $\Delta I_{DSAT}$, log $\Delta$Ig, or noise $\Delta 1/f$ plotted vs. log time.

In one example, plot 900 represents five sets of Vt characteristic measurements 903, 905 and 907 at three respective Vdd (e.g., VDDPPA 540) voltages. For example, line 902 represents the Vt characteristic measurements 903 at a first VDDPPA voltage over time, line 904 represents the Vt characteristic measurements 905 at a second VDDPPA voltage over time, and line 906 represents the Vt characteristic measurements 907 at a third VDDPPA voltage over time. Line 910 of FIG. 9A represents the resulting trend of the increasing change (log $\Delta$Vt) in the measured Vt characteristic over time. This trend 910 indicates a magnitude, a direction, and a rate of change of the measured characteristic which is useful in predicting the rate of degradation of each of the listed characteristics or other such characteristics which are felt to be predictive of PPA degradation and reliability.

As indicated above, the plot 900 may also represent data for other measured characteristics such as log $\Delta I_{DSAT}$, log $\Delta$Ig, or noise $\Delta 1/f$ plotted vs. log time.

Plot 920 of FIG. 9B illustrates exemplary results of peak detection over time, such as the first and second peak detections described above, and the usefulness of determining a slope of the results to provide certain degradation physics of the measured PPA device. For example, at a point 925 on plot 920, the rate of change of voltage $\Delta V$ relative to the rate of change of time $\Delta T$ provides the slope 930 or the rate of change of the peak voltage Vpeak, which may be used as an indicator of the rate of degradation of the output 555 of PPA 520 over time. Other such degradation determinations may be similarly identified as provided by the RF signal stressing and characteristic measurement methods and systems described and illustrated herein and as such, all such variations are anticipated in the context of the present invention.

In particular regard to the various functions performed by the above described components or structures (blocks, units, engines, assemblies, devices, circuits, systems, etc.), the terms (including a reference to a "means") used to describe such components are intended to correspond, unless otherwise indicated, to any component or structure which performs the specified function of the described component (or another functionally equivalent embodiment), even though not structurally equivalent to the disclosed structure which performs the function in the herein illustrated exemplary implementations of the invention.

In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising". In addition, to the extent that the terms "number", "plurality", "series", or variants thereof are used in the detailed description or claims, such terms are to include any number including, but not limited to: positive integers, negative integers, zero, and other values

What is claimed is:

1. A power amplifier (PA) test circuit, comprising:
    an oscillator configured to generate a radio frequency (RF) signal at a predetermined frequency;
    a parallel resonant circuit tuned to the predetermined frequency;
    a pre-power amplifier (PPA) coupled to the oscillator and the parallel resonant circuit, and configured to amplify and drive the RF signal generated by the oscillator at the predetermined frequency from an output of the PPA into a load;
    a disabling component configured to disable the RF signal from the oscillator based on the state of a disable signal;
    a first peak detector coupled to the output of the PPA, configured to detect one of a peak voltage or current, and a minimum voltage or current driven to the load; and
    a second peak detector coupled to an input of the PPA, configured to detect a peak voltage or minimum voltage of the RF signal input applied to the PPA.

2. A power amplifier (PA) test circuit, comprising:
    an oscillator configured to generate a radio frequency (RF) signal at a predetermined frequency;
    a parallel resonant circuit tuned to the predetermined frequency;
    a pre-power amplifier (PPA) coupled to the oscillator and the parallel resonant circuit, and configured to amplify and drive the RF signal generated by the oscillator at the predetermined frequency from an output of the PPA into a load;
    a disabling component configured to disable the RF signal from the oscillator based on the state of a disable signal; and
    a characterization component, configured to:
        stress the pre-power amplifier by coupling the RF signal from the oscillator to an input of the PPA using a first transmission gate;
        periodically measure the characteristic of the pre-power amplifier; and
        determine a stress degradation from the characteristic measurements of the pre-power amplifier.

3. The circuit of claim 2, further comprising
    a first transmission gate configured to couple the RF signal from the oscillator to an input of the PPA,
    a second transmission gate configured to couple an input test pad to an input of the PPA, and
    a third transmission gate configured to couple an output test pad to the output of the PPA.

4. The circuit of claim 2, further comprising
    a first peak detector coupled to the output of the PPA, configured to detect one of a peak voltage or current, and a minimum voltage or current driven to the load.

5. The circuit of claim 2, wherein the PPA comprises one of an nMOS and a pMOS transistor.

6. The circuit of claim 2, wherein the load comprises one of an antenna, a load equivalent to an antenna, or the parallel resonant circuit.

7. The circuit of claim 2, wherein the oscillator is one of a RF digitally controlled oscillator (DCO), or voltage controlled oscillator (VCO) configured to generate the RF signal at the predetermined frequency.

8. The circuit of claim 2, wherein the measured characteristic comprises one or a combination of a drain current Id, a gate voltage Vg, a noise 1/f, a peak voltage Vpeak, an output power, output conductance gds, transconductance (gm), and an I-V transfer characteristic.

9. The circuit of claim 8, wherein the stress degradation comprises one of a maximum slope or a time rate-of-change of the threshold voltage Vt, drain saturation current IDSAT, gate current Ig, noise1/f, power loss, and peak voltage Vpeak.

10. A power amplifier test circuit, comprising:
    a radio frequency (RF) digitally controlled oscillator (DCO) configured to generate an RF signal;

a parallel resonant circuit tuned to the frequency of the RF signal;

a pre-power amplifier (PPA) coupled to the DCO and the parallel resonant circuit, and configured to amplify and drive the RF signal generated by the DCO at the frequency of the RF signal from an output of the PPA into a load;

a first transmission gate configured to couple the RF signal from the DCO to an input of the PPA;

a second transmission gate configured to couple an input test pad to an input of the PPA; and a third transmission gate configured to couple an output test pad to the output of the PPA;

wherein the power amplifier test circuit is configured to allow external DC testing at the input and output test pads of the test circuit without external RF excitation.

11. A power amplifier test circuit, comprising:

a radio frequency (RF) digitally controlled oscillator (DCO) configured to generate an RF signal;

a parallel resonant circuit tuned to the frequency of the RF signal;

a pre-power amplifier (PPA) coupled to the DCO and the parallel resonant circuit, and configured to amplify and drive the RF signal generated by the DCO at the frequency of the RF signal from an output of the PPA into a load;

a first transmission gate configured to couple the RF signal from the DCO to an input of the PPA;

a first peak detector coupled to the output of the PPA, configured to detect one of a peak voltage or current, and a minimum voltage or current driven to the load; and a second peak detector coupled to an input of the PPA, configured to detect one of a peak voltage or a minimum voltage of the RF signal input applied to the PPA.

12. A power amplifier test circuit, comprising:

a radio frequency (RF) digitally controlled oscillator (DCO) configured to generate an RF signal;

a parallel resonant circuit tuned to the frequency of the RF signal;

a pre-power amplifier (PPA) coupled to the DCO and the parallel resonant circuit, and configured to amplify and drive the RF signal generated by the DCO at the frequency of the RF signal from an output of the PPA into a load; and a first transmission gate configured to couple the RF signal from the DCO to an input of the PPA;

wherein the digital pre-power amplifier test circuit comprises one of a built-in self-test (BIST) circuit, a wafer level test circuit, and a wafer level scribe line test circuit.

13. The circuit of claim 2, further comprising a second transmission gate configured to couple an input test pad to an input of the PPA, and a third transmission gate configured to couple an output test pad to the output of the PPA.

14. The circuit of claim 12, wherein the PPA comprises one of an nMOS and a pMOS transistor.

15. The circuit of claim 12, wherein the load comprises one of an antenna, a load equivalent to an antenna, or the parallel resonant circuit.

16. The circuit of claim 12, wherein the PPA comprises:

two or more digital control bits;

two or more control gates controlled by the digital control bits; and a switch array comprising two or more transistor switches controlled by the two or more control gates, the switches configured to be selectively coupled in parallel in response to the two or more digital control bits.

17. A power amplifier test circuit, comprising:

a radio frequency (RF) digitally controlled oscillator (DCO) configured to generate an RF signal;

a parallel resonant circuit tuned to the frequency of the RF signal;

a pre-power amplifier (PPA) coupled to the DCO and the parallel resonant circuit, and configured to amplify and drive the RF signal generated by the DCO at the frequency of the RF signal from an output of the PPA into a load; wherein the PPA comprises:

two or more digital control bits;

two or more control gates controlled by the digital control bits;

a switch array comprising two or more transistor switches controlled by the two or more control gates, the switches configured to be selectively coupled in parallel in response to the two or more digital control bits; and a parallel to serial transformation circuit configured to receive the selected two or more switches as inputs and to provide a power increase to the output of the PPA according to a binary weighting of the digital control bits; and a first transmission gate configured to couple the RF signal from the DCO to an input of the PPA.

* * * * *